United States Patent [19]

Min

[11] Patent Number: 5,606,452
[45] Date of Patent: Feb. 25, 1997

[54] ARRAY OF THIN FILM ACTUATED MIRRORS AND METHOD FOR THE MANUFACTURE THEREOF

[75] Inventor: Yong-Ki Min, Seoul, Rep. of Korea

[73] Assignee: Daewoo Electronics Co., Ltd., Seoul, Rep. of Korea

[21] Appl. No.: 548,034

[22] Filed: Oct. 25, 1995

[30] Foreign Application Priority Data

Nov. 14, 1994 [KR] Rep. of Korea ................... 94-29763

[51] Int. Cl.$^6$ ............................................. G02B 26/00
[52] U.S. Cl. .................... 359/295; 359/291; 359/221; 359/846; 359/855; 310/328; 310/366
[58] Field of Search ........................ 359/295, 290, 359/291, 221, 224, 213, 214, 846, 848, 855; 310/328, 333, 366

[56] References Cited

U.S. PATENT DOCUMENTS

| | | | |
|---|---|---|---|
| 3,544,201 | 12/1970 | Fowler et al. | 350/285 |
| 4,615,595 | 10/1986 | Hornbeck | 353/122 |
| 4,793,699 | 12/1988 | Tokuhara | 350/487 |
| 5,085,497 | 2/1992 | Um et al. | 359/848 |
| 5,126,836 | 6/1992 | Um | 358/60 |
| 5,159,225 | 10/1992 | Um | 310/328 |
| 5,172,262 | 12/1992 | Hornbeck | 359/223 |
| 5,175,465 | 12/1992 | Um et al. | 310/328 |
| 5,185,660 | 2/1993 | Um | 358/60 |
| 5,216,537 | 6/1993 | Hornbeck | 359/291 |
| 5,247,222 | 9/1993 | Engle | 310/328 |
| 5,469,302 | 11/1995 | Lim | 359/846 |
| 5,481,396 | 1/1996 | Ji et al. | 359/295 |

FOREIGN PATENT DOCUMENTS

| | | |
|---|---|---|
| 2239101 | 6/1991 | United Kingdom. |
| 2258055 | 1/1993 | United Kingdom. |
| WO91/09503 | 6/1991 | WIPO. |

*Primary Examiner*—Loha Ben
*Attorney, Agent, or Firm*—Pennie & Edmonds

[57] ABSTRACT

An array of M×N thin film actuated mirrors includes an active matrix having a substrate with an array of M×N connecting terminals and an array of M×N transistors, and an array of M×N actuating structures, wherein each of the actuating structures being a bimorph structure, includes a second thin film electrode, a lower electrodisplacive member, an intermediate thin film electrode, an upper electrodisplacive member and a first thin film electrode. Furthermore, there is disclosed a method for the manufacture thereof, the method comprising the steps of: providing an active matrix; forming a thin film sacrificial layer on top of the active matrix; removing selectively the thin film sacrificial layer; forming a second thin film electrode layer thereon; removing selectively the second thin film electrode layer; depositing a lower electrodisplacive layer; forming an intermediate electrode layer; depositing an upper electrodisplacive layer; forming a first thin film electrode layer, thereby forming a multiple layered structure; patterning the multiple layered structure into an array of M×N semifinished actuating structures; and removing the thin film sacrificial layer.

11 Claims, 10 Drawing Sheets

ARRAY OF THIN FILM ACTUATED MIRRORS AND METHOD FOR THE MANUFACTURE THEREOF

FIELD OF THE INVENTION

The present invention relates to an optical projection system; and, more particularly, to an array of M×N thin film actuated mirrors, wherein each of the thin film actuated mirrors has a bimorph structure, for use in the system and a method for the manufacture thereof.

BACKGROUND OF THE INVENTION

Among the various video display systems available in the art, an optical projection system is known to be capable of providing high quality displays in a large scale. In such an optical projection system, light from a lamp is uniformly illuminated onto an array of, e.g., M×N, actuated mirrors, wherein each of the mirrors is coupled with each of the actuators. The actuators may be made of an electrodisplacive material such as a piezoelectric or an electrostrictive material which deforms in response to an electric field applied thereto.

The reflected light beam from each of the mirrors is incident upon an aperture of, e.g., an optical baffle. By applying an electrical signal to each of the actuators, the relative position of each of the mirrors to the incident light beam is altered, thereby causing a deviation in the optical path of the reflected beam from each of the mirrors. As the optical path of each of the reflected beams is varied, the amount of light reflected from each of the mirrors which passes through the aperture is changed, thereby modulating the intensity of the beam. The modulated beams through the aperture are transmitted onto a projection screen via an appropriate optical device such as a projection lens, to thereby display an image thereon.

In FIGS. 1A to 1G, there are illustrated manufacturing steps involved in manufacturing an array 10 of M×N thin film actuated mirrors 11, wherein M and N are integers, disclosed in a copending commonly owned application,. U.S. Ser. No. 08/430,628, entitled "THIN FILM ACTUATED MIRROR ARRAY".

The process for manufacturing the array 10 begins with the preparation of an active matrix 20 having a top surface and comprising a substrate 22, an array of M×N transistors-(not shown), a conduction line pattern(not shown) and an array of M×N connecting terminals 24.

In a subsequent step, there is formed on the top surface of the active matrix 20 a thin film sacrificial layer 40 by using a sputtering or an evaporation method if the thin film sacrificial layer 40 is made of a metal, a chemical vapor deposition(CVD) or a spin coating method if the thin film sacrificial layer 40 is made of a phosphor-silicate glass(PSG), or a CVD method if the thin film sacrificial layer 40 is made of a poly-Si.

Thereafter, there is formed a supporting layer 15 including an array of M×N supporting members 30 surrounded by the thin film sacrificial layer 40, wherein the supporting layer 15 is formed by: creating an array of M×N empty slots(not shown) on the thin film sacrificial layer 40 by using a photolithography method, each of the empty slots being located around each of the connecting terminals 24; and forming a supporting member 30 in each of the empty slots located around each of the connecting terminals 24 by using a sputtering or a CVD method, as shown in FIG. 1A. The supporting members 30 are made of an insulating material.

In a following step, an elastic layer 70 made of the same insulating material as the supporting members 30 is formed on top of the supporting layer 15 by using a Sol-Gel, a sputtering or a CVD method.

Subsequently, a conduit 35 made of a metal is formed in each of the supporting members 30 by: first creating an array of M×N holes(not shown), each of the holes extending from top of the elastic layer 70 to top of each of the connecting terminals 24, by using an etching method; and filling therein with the metal to thereby form the conduit 35, as shown in FIG. 1B.

In a next step, a second thin film layer 60 made of an electrically conducting material is formed on top of the elastic layer 70 including the conduits 35 by using a sputtering method. The second thin film layer 60 is electrically connected to the transistors through the conduits 35 formed in the supporting members 30.

Then, a thin film electrodisplacive layer 80 made of a piezoelectric material, e.g., lead zirconium titanate(PZT), is formed on top of the second thin film layer 60 by using a sputtering method, a CVD method or a Sol-Gel method, as shown in FIG. 1C.

In an ensuing step, the thin film electrodisplacive layer 80, the second thin film layer 60 and the elastic layer 70 are patterned into an array of M×N thin film electrodisplacive members 85, an array of M×N second thin film electrodes 65 and an array of M×N elastic members 75 by using a photolithography or a laser trimming method until the supporting layer 15 is exposed, as shown in FIG. 1D. Each of the second thin film electrodes 65 is connected electrically to each of the transistors through each of the conduits 35 formed in each of the supporting members 30 and functions as a signal electrode in the thin film actuated mirrors 11.

Next, each of the thin film electrodisplacive members 85 is heat treated at a high temperature, e.g., for PZT, around 650° C., to allow a phase transition to take place to thereby form an array of M×N heat treated structures (not shown). Since each of the heat treated thin film electrodisplacive members 85 is sufficiently thin, there is no need to pole it in case it is made of a piezoelectric material: for it can be poled with the electric signal applied during the operation of the thin film actuated mirrors 11.

After the above step, an array of M×N first thin film electrodes 50 made of an electrically conducting and light reflecting material is formed on top of the thin film electrodisplacive members 85 in the array of M×N heat treated structures by first forming a layer 88, made of an electrically conducting and light reflecting material, completely covering top of the array of M×N heat treated structures, including the exposed supporting layer 15, using a sputtering method, as shown in FIG. 1E, and then selectively removing the layer 88, using an etching method, resulting in an array 90 of M×N actuated mirror structures 95, wherein each of the actuated mirror structures 95 includes a top surface and four side surfaces, as shown in FIG. 1F. Each of the first thin film electrodes 50 functions as a mirror as well as a bias electrode in the thin film actuated mirrors 11.

The preceeding step is then followed by completely covering the top surface and the four side surfaces in each of the actuated mirror structures 95 with a thin film protection layer (not shown).

The thin film sacrificial layer 40 of the supporting layer 15 is then removed by using an etching method. Finally, the thin film protection layer is removed to thereby form the array 10 of M×N thin film actuated mirrors 11, as shown in FIG. 1G.

There are certain deficiencies associated with the above described method for manufacturing the array 10 of M×N thin film actuated mirrors 11. The formation of the thin film electrodisplacive members 85 involves a high temperature, and therefore, care should be taken in selecting a proper material for the thin film sacrificial layer 40 capable of withstanding the high temperature required in the formation thereof. In addition, since the method for the manufacture of the array 10 involves the high temperature process, the materials used for the electrodes in the thin film actuated mirrors 11 and the conduction line pattern in the active matrix 20 must be also able to withstand the high temperature, and such materials are usually expensive, which will, in turn, increase the manufacturing cost of the array 10.

Furthermore, the high temperature required during the formation of the thin film electrodisplacive members 85 may adversely affect the structural integrity of each of the actuated mirrors 11, which, may compromise the overall performance of the array 10.

SUMMARY OF THE INVENTION

It is, therefore, a primary object of the present invention to provide an array of M×N thin film actuated mirrors for use in an optical projection system which dispenses with the high temperature process during the manufacture thereof.

It is another object of the present invention to provide a method for the manufacture of an array of M×N thin film actuated mirrors for use in an optical projection system which avoids the high temperature process, thereby making it easier to select the material for the thin film sacrificial layer.

In accordance with one aspect of the present invention, there is provided an array of M×N thin film actuated mirrors, wherein M and N are integers, for use in an optical projection system, each of the thin film actuated mirrors having a bimorph structure, the array comprising: an active matrix having a top surface and including a substrate with an array of M×N connecting terminals and an array of M×N transistors; and an array of M×N actuating structures, each of the actuating structures provided with a proximal and a distal ends, each of the actuating structures including a second thin film electrode for functioning as a second bias electrode, a lower electrodisplacive member having a top and a bottom surfaces, an intermediate thin film electrode for functioning as a signal electrode, an upper electrodisplacive member having a top and a bottom surfaces and a first thin film electrode for functioning as a mirror as well as a first bias electrode, wherein the upper and the lower electrodisplacive members are separated by the intermediate thin film electrode, the first thin film electrode is placed on the top surface of the upper electrodisplacive member, the second thin film electrode is located on the bottom surface of the lower electrodisplacive member, the intermediate thin film electrode is electrically connected to each of the transistors through each of the connecting terminals, and the proximal end of each of the actuating structures is attached to the top surface of the active matrix to thereby form said thin film actuated mirror having the bimorph structure.

In accordance with another aspect of the present invention, there is provided a method for the manufacture of an array of M×N thin film actuated mirrors, wherein M and N are integers, for use in an optical projection system, each of the thin film actuated mirrors having a bimorph structure, the method comprising the steps of: providing an active matrix having a top surface, the active matrix including a substrate with an array of M×N transistors and an array of M×N connecting terminals; depositing a thin film sacrificial layer on the top surface of the active matrix; removing portions of the thin film sacrificial layer formed on top of each of the connecting terminals; forming a second thin film electrode layer made of a second electrically conducting material on top of the active matrix including the thin film sacrificial layer; removing portions of the second thin film electrode layer formed on top of each of the connecting terminals in the active matrix; depositing a lower electrodisplacive layer on top of the active matrix and the second thin film electrode layer; creating an array of M×N holes, each of the holes having internal surfaces and extending from top of the lower electrodisplacive layer to top of each of the connecting terminals; forming an intermediate electrode layer made of a first electrically conducting material on top of the lower electrodisplacive layer including the internal surfaces of each of the holes; depositing an upper electrodisplacive layer on top of the intermediate electrode layer while filling the holes; forming a first thin film electrode layer made of an electrically conducting and light reflecting material on top of the upper electrodisplacive layer, thereby forming a multiple layered structure including the first thin film electrode layer, the upper electrodisplacive layer, the intermediate electrode layer, the lower electrodisplacive layer, and the second thin film electrode layer; patterning the multiple layered structure into an array of M×N semifinished actuating structures, wherein each of the semifinished actuating structures includes a first thin film electrode, an upper electrodisplacive member, an intermediate thin film electrode, a lower electrodisplacive member, and a second thin film electrode; and removing the thin film sacrificial layer to thereby form said array of M×N thin film actuated mirrors.

BRIEF DESCRIPTION OF THE DRAWINGS

The above and other objects and features of the present invention will become apparent from the following description of the preferred embodiments given in conjunction with the accompanying drawings, wherein.

DETAILED DESCRIPTION OF THE PREFERRED EMBODIMENTS

Figure 1A:
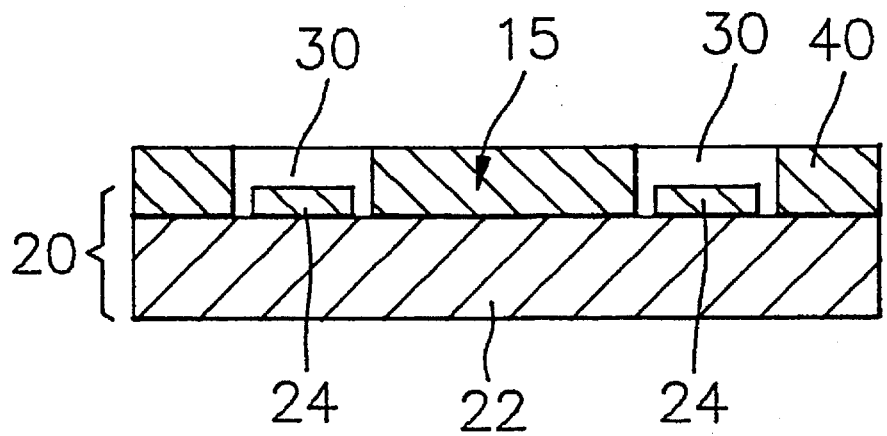
FIGS. 1A to 1G are schematic cross sectional views illustrating a method for the manufacture of an array of M×N thin film actuated mirrors previously disclosed.
Figure 1B:
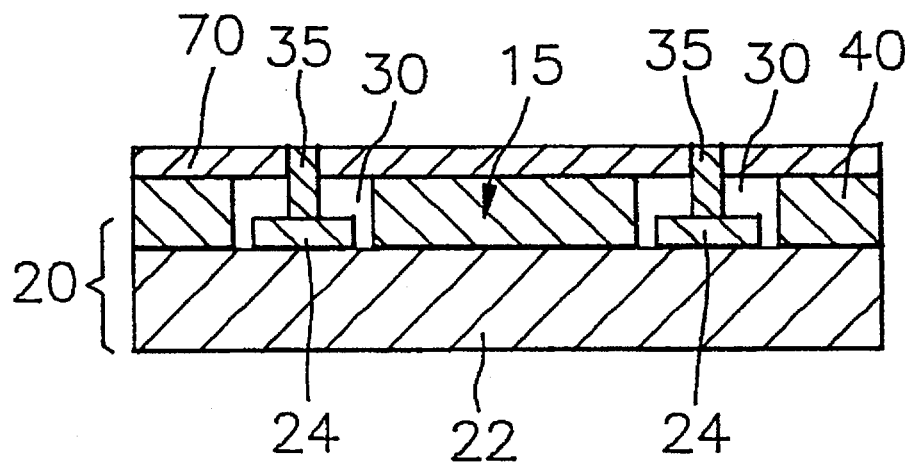
Figure 1C:
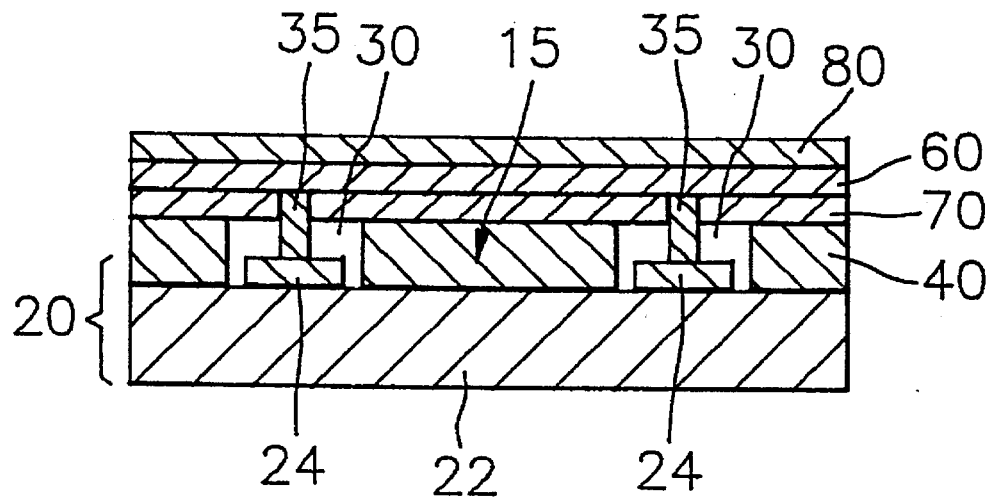
Figure 1D:
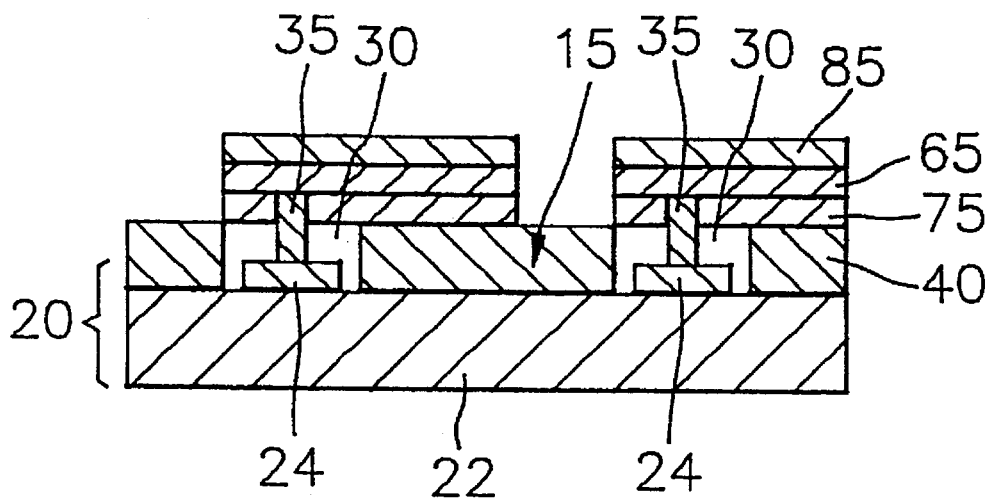
Figure 1E:
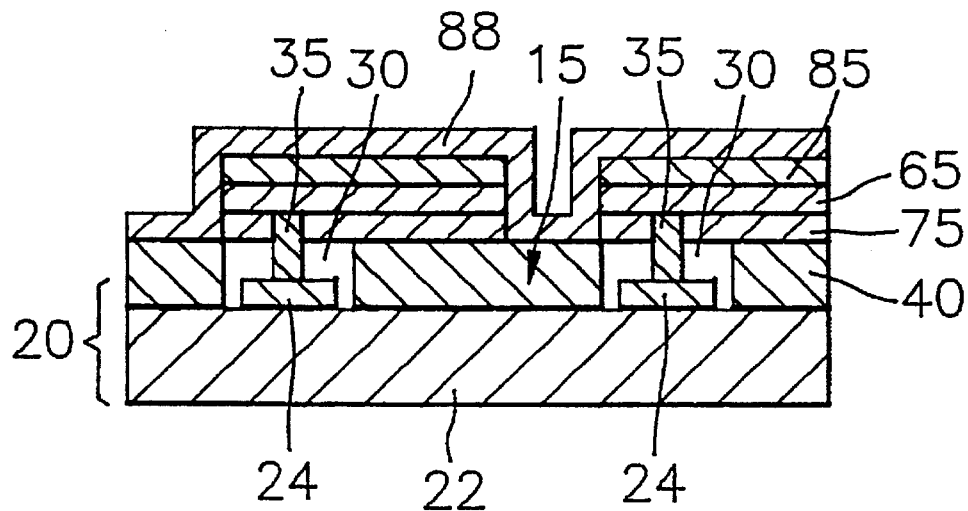
Figure 1F:
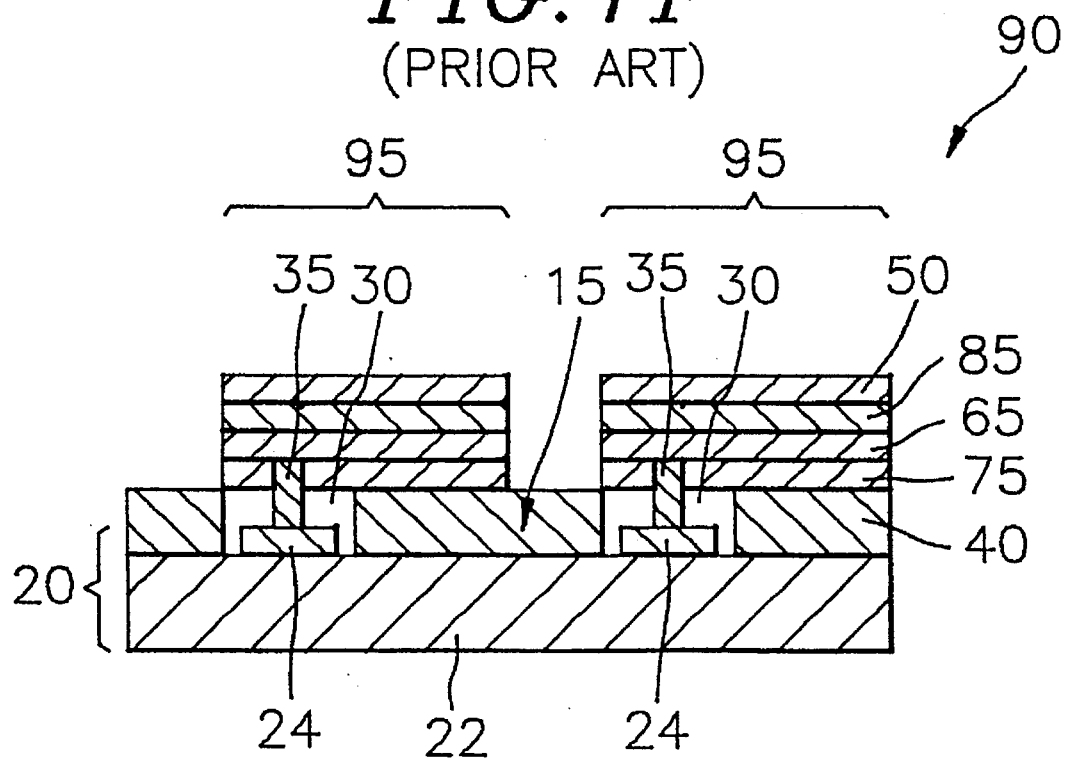
Figure 1G:
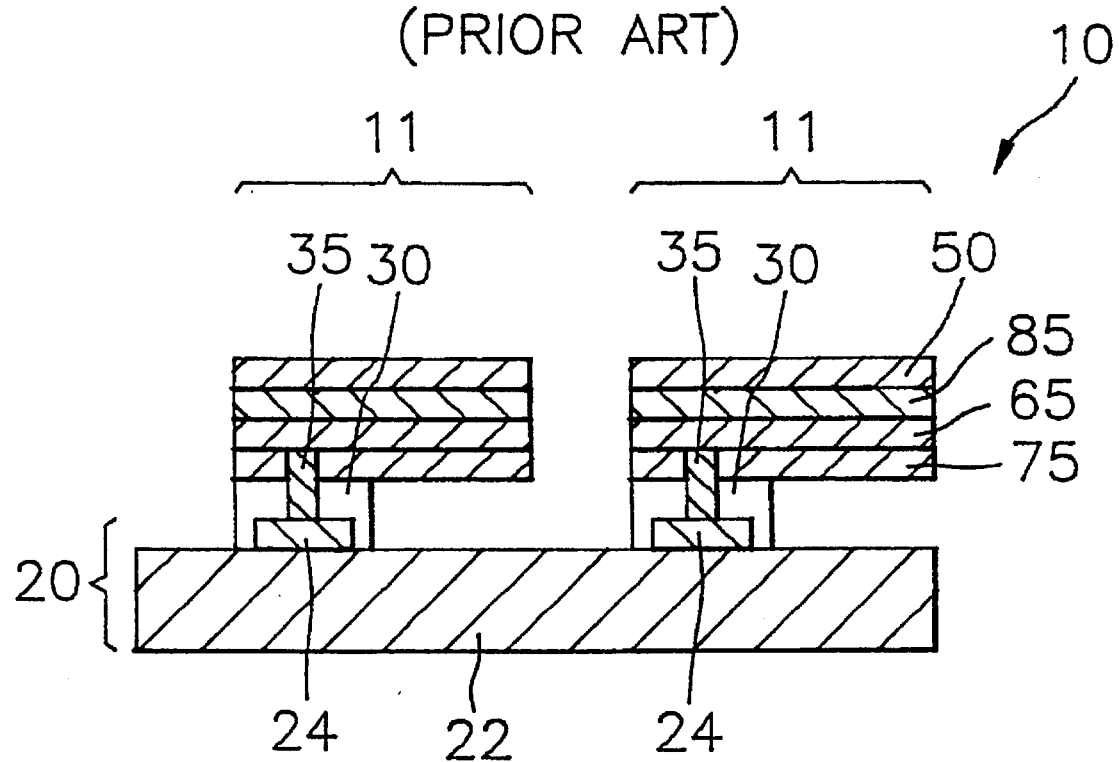

There are provided in FIGS. 2 and 3A to 3I a perspective cross sectional view of an array 100 of M×N thin film actuated mirrors 101, wherein M and N are integers, for use in an optical projection system and schematic cross sectional views setting forth a method for the manufacture thereof in accordance with preferred embodiments of the present invention, respectively. It should be noted that like parts appearing in FIGS. 2 and 3A to 3I are represented by like reference numerals.

Figure 2:
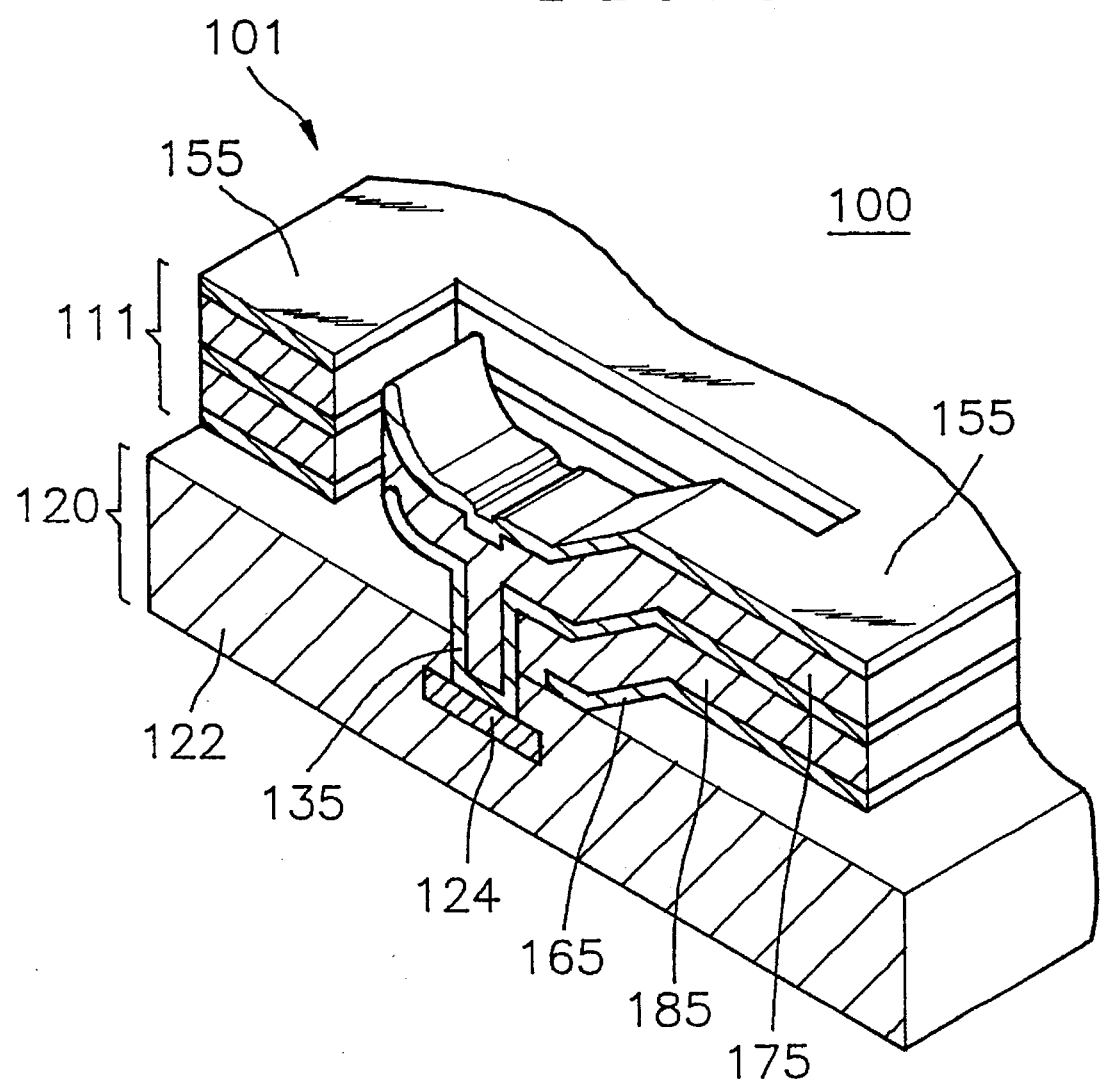
FIG. 2 is a perspective cross sectional view of an array of M×N thin film actuated mirrors in accordance with the present invention.

In FIG. 2, there is provided a perspective cross sectional view of the inventive array 100 of M×N thin film actuated mirrors 101 comprising an active matrix 120 and an array of M×N actuating structures 111, wherein each of the actuating structures 111 has a bimorph structure.

The active matrix 120 has a top Surface and includes a substrate 122 with an array of M×N connecting terminals 124, a conduction line pattern(not shown) and an array of M×N transistors(not shown), each of the connecting terminals 124 being electrically connected to each Of the transistors.

Each of the actuating structures 111, provided with a proximal and a distal ends, includes a second thin film electrode 165 for functioning as a second bias electrode, a lower electrodisplacive member 185 having a top and a bottom surfaces, an intermediate thin film electrode 135 for functioning as a signal electrode, an upper electrodisplacive member 175 having a top and a bottom surfaces and a first thin film electrode 155 for functioning as a mirror as well as a first bias electrode, wherein the proximal end of each of the actuating structures 111 is attached to the top surface of the active matrix 120, and the first and the second thin film electrodes 155, 165 are electrically connected to each other. The upper and the lower electrodisplacive members 175, 185 are separated by the intermediate thin film electrode 135. The first thin film electrode 155 is placed on the top surface of the upper electrodisplacive member 175. The second thin film electrode 165 is located on the bottom surface of the lower electrodisplacive member 185. The intermediate thin film electrode 135 is electrically connected to each of the transistors through each of the connecting terminals 124. The upper and the lower electrodisplacive members 175, 185 in each of the thin film actuated mirrors 101 are made of a crystallographically asymmetric material, e.g., zinc oxide(ZnO), the material further being characterized in that: it exhibits no hysteresis loop; and it can be formed at a temperature ranging from 200° C. to 300° C. The use of such a material for the upper and the lower electrodisplacive members 175, 185, in turn, allows the use of low melting and cheaper electrode materials, such as aluminum(Al) or silver(Ag), in the first, the second, and the intermediate thin film electrodes 155, 165, 135, thereby reducing the overall manufacturing cost of the array 100.

The polarization direction of the upper electrodisplacive member 175 is identical to that of the lower electrodisplacive member 185. When an electric field is applied across the upper and the lower electrodisplacive members 175, 185 in each of the thin film actuated mirrors 101, the polarization direction in one of the electrodisplacive members coincides with the electric field and that of the other electrodisplacive member is opposite from the electric field. In such an event, the electrodisplacive member whose polarization direction coincides with the electric field will expand vertically and contract horizontally, and the electrodisplacive member whose polarization direction is opposite from the electric field will contract vertically and expand horizontally, thereby giving rise to a bimorph mode.

FIGS. 3A to 3I are schematic cross sectional views setting forth the method for the manufacture of an array 100 of M×N thin film actuated mirrors 101 in accordance with the present invention.

The process for manufacturing the array 100 begins with the preparation of an active matrix 120 having a top surface and including a substrate 122 with an array of M×N connecting terminals 124, a conduction line pattern(not shown) and an array of M×N transistors(not shown), wherein the substrate 122 is made of an insulating material, e.g., glass.

Thereafter, a thin film sacrificial layer 140, made of an oxide, e.g., ZnO, or a polymer, e.g., a polyimide, and having a thickness of 1–2 μm, is formed oil top of the active matrix 120 by using a sputtering or a vacuum evaporation method if the thin film sacrificial layer 140 is made of an oxide, and a spin coating method if the thin film sacrificial layer 140 is made of a polymer. As noted earlier, the use of ZnO for the upper and the lower electrodisplacive members 175, 185 eliminates the high temperature process employed in the prior art, allowing the selection of a proper material for the thin film sacrificial layer 140 much easier.

Figure 3A:
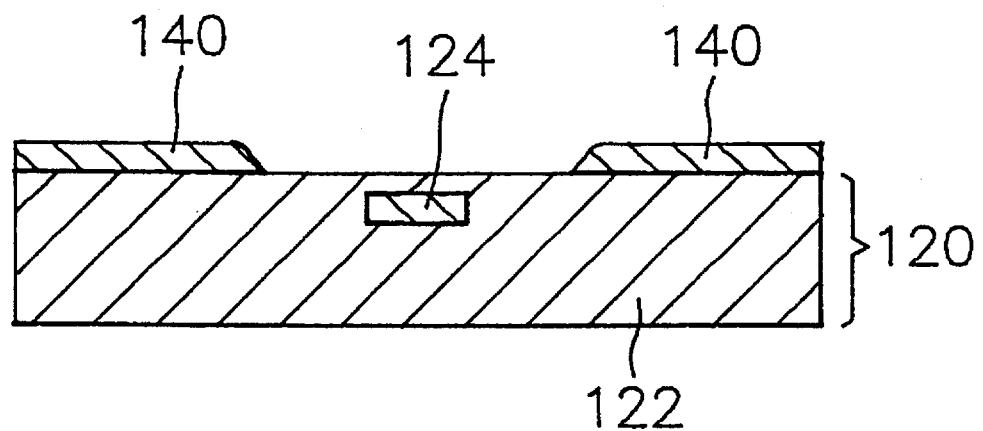
FIGS. 3A to 3I are schematic cross sectional views setting forth a method for the manufacture of an array of M×N thin film actuated mirrors in accordance with the present invention.

In the ensuing step, portions of the thin film sacrificial layer 140 formed on top of each of the connecting terminals 124 in the active matrix 120 are removed by using a photolithography method, as shown in FIG. 3A.

In the subsequent step, a second thin film electrode layer 160, made of a second electrically conducting material, e.g., Al, and having a thickness of 0.1–2 μm, is formed on top of the active matrix 120 including the thin film sacrificial layer 140 by using a sputtering or a vacuum evaporation method.

Figure 3B:
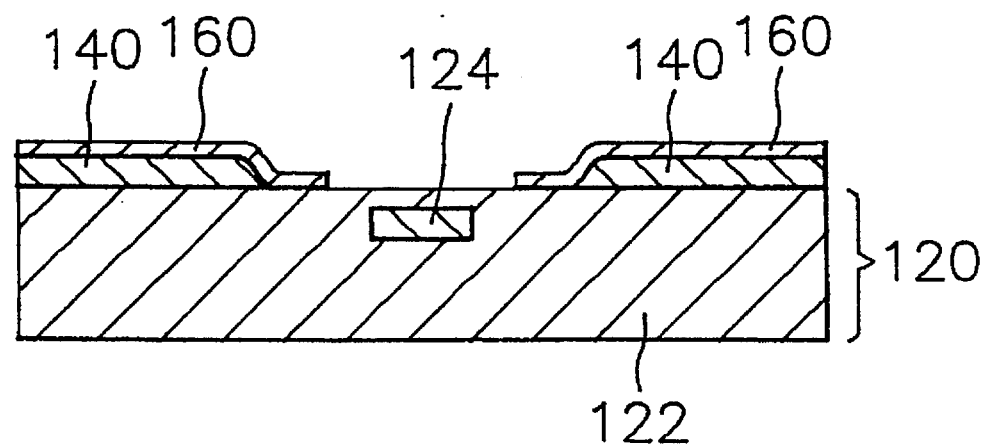

Thereafter, portions of the second thin film electrode layer 160 formed on top of each of the connecting terminals 124 in the active matrix 120 are removed by using a photolithography or a laser trimming method, as shown in FIG. 3B.

Figure 3C:
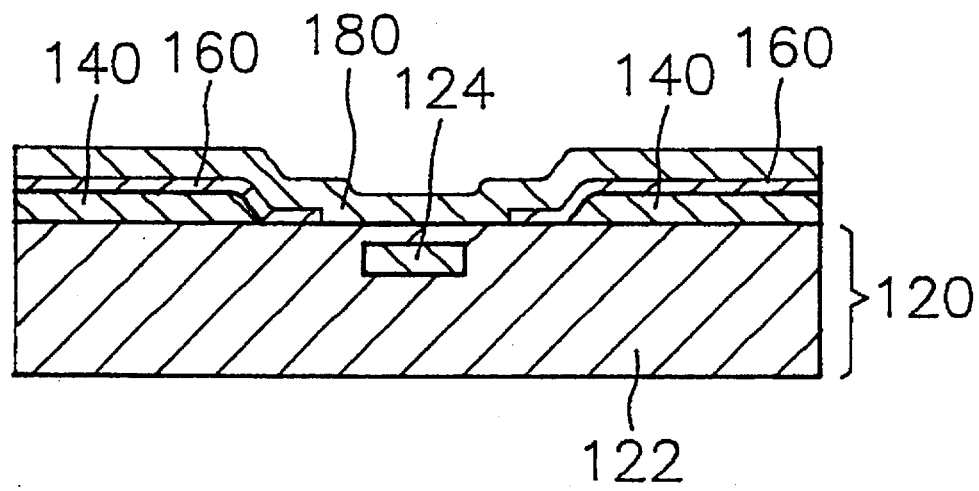

As shown in FIG. 3C, a lower electrodisplacive layer 180 made of ZnO in a thickness of 0.1–2 μm is formed on top of the active matrix 120 including the second thin film electrode layer 160 by using a vacuum evaporation or a sputtering method. A thin film of ZnO can be formed around 200°–300° C.

Figure 3D:
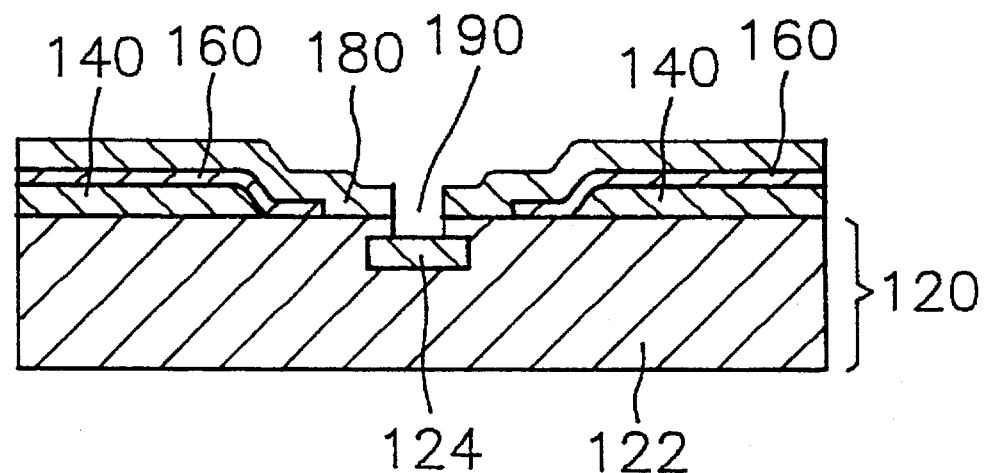

In the ensuing step, as shown in FIG. 3D, an array of M×N holes 190 is formed, each of the holes 190 having internal surfaces and extending from top of the lower electrodisplacive layer 180, passing through the active matrix 120, to top of each of the connecting terminals 124, by using an etching method.

Figure 3E:
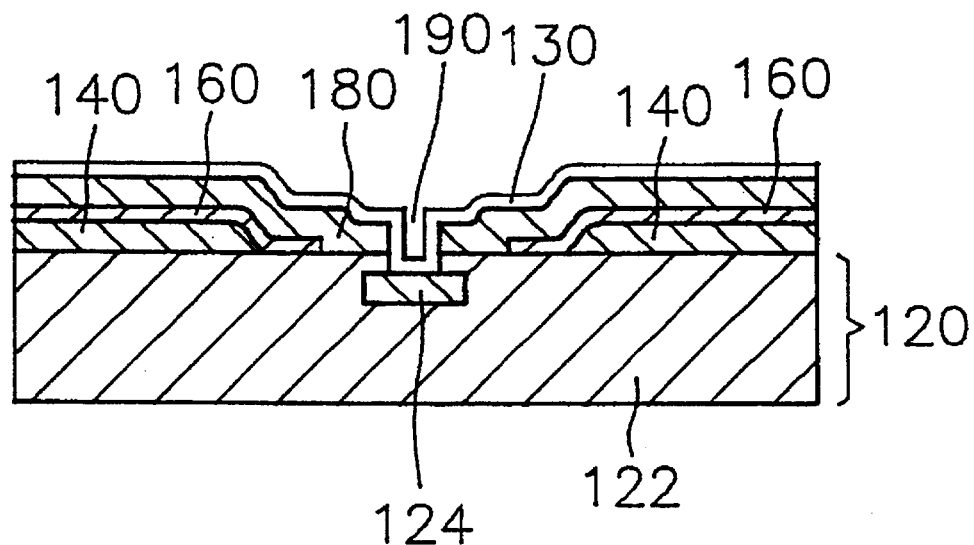

As shown in FIG. 3E, an intermediate electrode layer 130, made of a first electrically conducting material, e.g., Al, and having a thickness of 0.1–2 μm, is formed on top of the lower electrodisplacive layer 180 including the internal surfaces of the holes 190 by using a sputtering or a vacuum evaporation method.

Figure 3F:
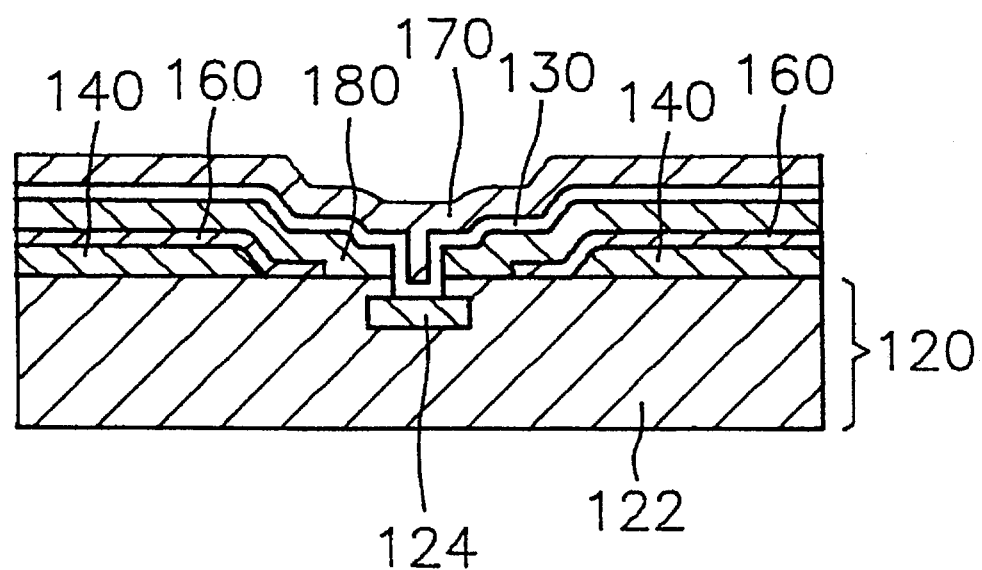

In the subsequent step, an upper electrodisplacive layer 170, made of the same material as the lower electrodisplacive layer 180, and having a thickness of 0.1–2 μm, is formed on top of the intermediate electrode layer 130 while filling the holes 190 by using a vacuum evaporation or a sputtering method, as shown in FIG. 3F.

Figure 3G:
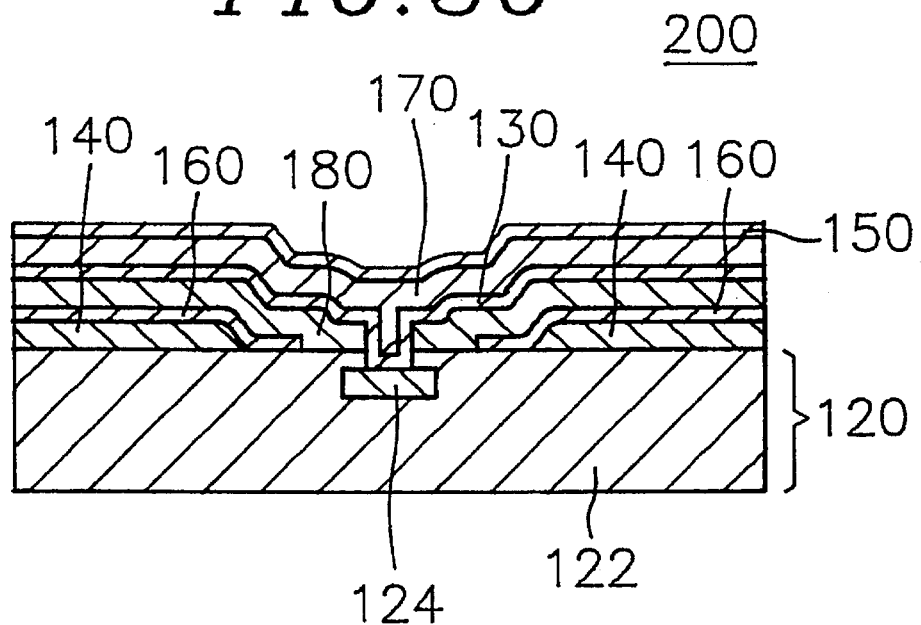

As shown in FIG. 3G, a first thin film electrode layer 150, made of an electrically conducting and light reflecting material, e.g., Al or Ag, and having a thickness of 0.1–2 μm, is formed on top of the upper electrodisplacive layer 170 by using a sputtering or a vacuum evaporation method to thereby form a multiple layered structure 200 including the first thin film electrode layer 150, the upper electrodisplacive layer 170, the intermediate electrode layer 130, the lower electrodisplacive layer 180 and the second thin film electrode layer 160.

Figure 3H:
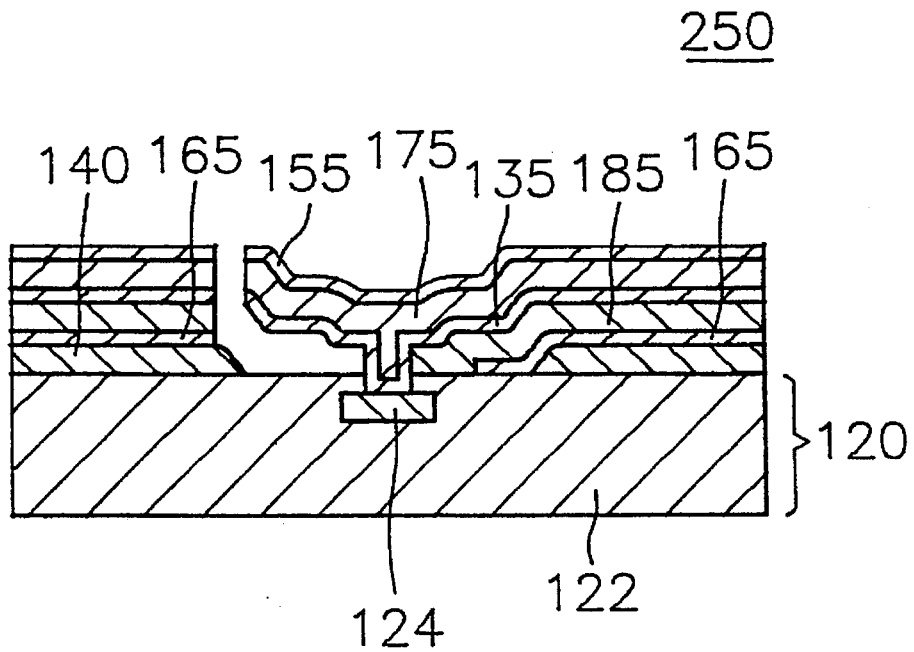

Thereafter, the multiple layered structure 200 is patterned into an array of M×N semifinished actuating structures 250 including the first thin film electrode 155, the upper electrodisplacive member 175, the intermediate thin film electrode 135, the lower electrodisplacive member 185 and the second thin film electrode 165 until the thin film sacrificial layer 140 is exposed by using a photolithography or a laser trimming method, as shown in FIG. 3H.

Figure 3I:
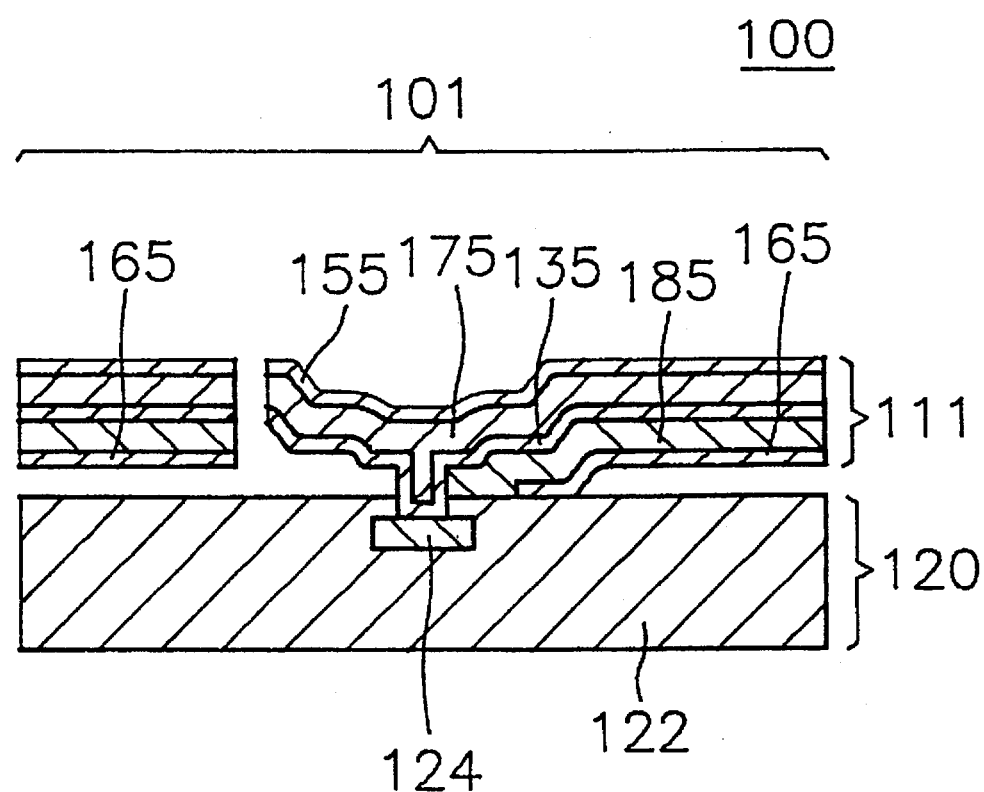

In the ensuing step, the thin film sacrificial layer 140 is then removed by using an etching method to thereby form the array 100 of M×N thin film actuated mirrors 101, as shown in FIG. 3I.

In contrast with the method for the manufacture of the array 10 of M×N thin film actuated mirrors 11 previously disclosed, wherein the high temperature process is required for forcing the phase transition in the electrodisplacive material constituting the thin film electrodisplacive layer 80, in the inventive method, as the upper and the lower electrodisplacive members 175, 185 of each of the actuating structures 111 are made of ZnO, the high temperature process can be dispensed with, making it possible to select a material to be used for the thin film sacrificial layer 140 from a wider range of materials.

In addition, the use of ZnO for the upper and the lower electrodisplacive members 175, 185 allows the use of low melting and hence cheaper materials, in the first, the second, and the intermediate thin film electrodes 155, 165, 135, in the thin film actuated mirrors 101 and the conduction line pattern in the active matrix 120, thereby reducing the overall manufacturing cost of the array 100.

Furthermore, since the array 100 is formed without using the high temperature process, the structural integrity, and hence the performance thereof, can be better preserved.

While the present invention has been described with respect to certain preferred embodiments only, other modifications and variations may be made without departing from the scope of the present invention as set forth in the following claims.

What is claimed is:

1. An array of M×N thin film actuated mirrors, wherein M and N are integers, for use in an optical projection system, each of the thin film actuated mirrors having a bimorph structure, the array comprising:

an active matrix having a top surface and including a substrate with an array of M×N connecting terminals and an array of M×N transistors; and an array of M×N actuating structures, each of the actuating structures having a proximal and a distal ends, each of the actuating structures including a second thin film electrode for functioning as a second bias electrode, a lower electrodisplacive member having a top and a bottom surfaces, an intermediate thin film electrode for functioning as a signal electrode, an upper electrodisplacive member having a top and a bottom surfaces and a first thin film electrode for functioning as a mirror as well as a first bias electrode, wherein the upper and the lower electrodisplacive members are separated by the intermediate thin film electrode, the first thin film electrode is placed on the top surface of the upper electrodisplacive member, the second thin film electrode is located on the bottom surface of the lower electrodisplacive member, the intermediate thin film electrode is electrically connected to each of the transistors through each of the connecting terminals, and the proximal end of each of the actuating structures is attached to the top surface of the active matrix to thereby form the thin film actuated mirror having the bimorph structure.

2. The array of claim 1, wherein the first thin film electrode is electrically connected to the second thin film electrode.

3. A method for the manufacture of an array of M×N thin film actuated mirrors, wherein M and N are integers, for use in an optical projection system, each of the thin film actuated mirrors having a bimorph structure, the method comprising the steps of:

providing an active matrix having a top surface, the active matrix including a substrate with an array of M×N transistors and an array of M×N connecting terminals;

depositing a thin film sacrificial layer on the top surface of the active matrix;

removing portions of the thin film sacrificial layer formed on top of each of the connecting terminals on the active matrix;

forming a second thin film electrode layer made of a second electrically conducting material on top of the active matrix including the thin film sacrificial layer;

removing portions of the second thin film electrode layer formed on top of each of the connecting terminals in the active matrix;

depositing a lower electrodisplacive layer on top of the active matrix and the second thin film electrode layer;

creating an array of M×N holes, each of the holes having internal surfaces and extending from top of the lower electrodisplacive layer to top of each of the connecting terminals;

forming an intermediate electrode layer made of a first electrically conducting material on top of the lower electrodisplacive layer including the internal surfaces of each of the holes;

depositing an upper electrodisplacive layer on top of the intermediate electrode layer while filling the holes;

forming a first thin film electrode layer made of an electrically conducting and light reflecting material on top of the upper electrodisplacive layer, thereby forming a multiple layered structure including the first thin film electrode layer, the upper electrodisplacive layer, the intermediate electrode layer, the lower electrodisplacive layer, and the second thin film electrode layer;

patterning the multiple layered structure into an array of M×N semifinished actuating structures, wherein each of the semifinished actuating structures includes a first thin film electrode, an upper electrodisplacive member, an intermediate thin film electrode, a lower electrodisplacive member, and a second thin film electrode; and removing the thin film sacrificial layer to thereby form the array of M×N thin film actuated mirrors.

4. The method of claim 3, wherein the upper and the lower electrodisplacive layers are made of a crystallographically asymmetric material.

5. The method of claim 4, wherein the crystallographically asymmetric material is ZnO.

6. The method of claim 3, wherein the upper and the lower electrodisplacive layers are formed in a thickness of 0.1–2 μm.

7. The method of claim 3, wherein the upper and the lower electrodisplacive layers are formed by using a vacuum evaporation or a sputtering method.

8. The method of claim 3, wherein the thin film sacrificial layer is made of an oxide or a polymer.

9. The method of claim 3, wherein the thin film sacrificial layer is formed by using a sputtering or a vacuum evaporation method if the thin film sacrificial layer is made of an oxide, and a spin coating method if the thin film sacrificial layer is made of a polymer.

10. The method of claim 3, wherein the first thin film, the second thin film and the intermediate electrode layers are formed by using a sputtering or a vacuum evaporation method.

11. The method of claim 3, wherein the second thin film electrode layer, the intermediate electrode layer and the first thin film electrode layer are formed in a thickness of 0.1–2 μm.

* * * * *